US006780739B1

(12) United States Patent
Mao et al.

(10) Patent No.: US 6,780,739 B1
(45) Date of Patent: Aug. 24, 2004

(54) BIT LINE CONTACT STRUCTURE AND METHOD FOR FORMING THE SAME

(75) Inventors: Hui-Min Mao, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/613,254

(22) Filed: Jul. 3, 2003

(30) Foreign Application Priority Data

Apr. 10, 2003 (TW) ........................................ 92108221 A

(51) Int. Cl.[7] ........................................ H01L 21/8242
(52) U.S. Cl. ........................ 438/586; 438/597; 438/629; 438/637; 438/648; 438/685; 438/700; 438/745; 438/785; 257/382; 257/383
(58) Field of Search ................................ 438/785, 586, 438/597, 620, 629, 637, 648, 685, 700, 745, FOR 196; 257/382, 383, 584

(56) References Cited

U.S. PATENT DOCUMENTS 6,034,401 A * 3/2000 Hsia et al. .................. 257/369
6,399,438 B2 * 6/2002 Saito et al. .................. 438/253
6,495,408 B1 * 12/2002 Hsia et al. .................. 438/214
2001/0005611 A1 * 6/2001 Kim ........................... 438/239
2002/0068423 A1 * 6/2002 Park et al. .................. 438/586
2002/0100980 A1 * 8/2002 Sugiyama et al. .......... 257/758
2002/0149050 A1 * 10/2002 Fazio et al. ................. 257/314
2003/0015750 A1 * 1/2003 Deboer et al. .............. 257/301
2003/0073280 A1 * 4/2003 Kobayashi et al. ......... 438/239
2003/0099131 A1 * 5/2003 Schloesser et al. ......... 365/174

* cited by examiner

*Primary Examiner*—George Fourson
*Assistant Examiner*—Joannie Adelle Garcia
(74) *Attorney, Agent, or Firm*—Quintero Law Office

(57) ABSTRACT

A bit line contact structure and method for forming the same. After forming transistors on a substrate, Ti layer, TiN layer and W layer conformally cover the transistors and the substrate. The Ti/TiN/W stacked layer is defined to form an inner landing pad connecting to a source/drain region. A passivation layer is formed on the inner landing pad, the transistors and the substrate. An insulating layer with a flat surface is then formed on the passivation layer. A contact hole is formed in the insulating layer and the passivation layer to expose the inner landing pad. A M0 etching process is performed to form a recess of interconnecting landing pad patterns in the upper portion of the contact hole. An M0 deposition process is then performed.

29 Claims, 11 Drawing Sheets

BIT LINE CONTACT STRUCTURE AND METHOD FOR FORMING THE SAME

BACKGROUND OF THE INVENTION

1. Field of the Invention

The present invention relates in general to a method of forming a contact structure in particular, the present invention relates to a method of forming a bit line contact structure comprising an inner landing pad and a contact plug.

2. Description of the Related Art

Embedded DRAM applications demand both the utmost in high-performance CMOS (complementary metal oxide semiconductor) logic devices and high-density DRAM arrays. High-performance CMOS logic devices require low-resistance gate conductors and source drain diffusions (salicidation), which drive processes that are costly and difficult to integrate with high-density DRAM processes. For example, salicided gates and source/drain regions greatly complicate the processes for forming array MOSFETs since the array MOSFETs need bit line contact plugs which are borderless to adjacent word line conductors; also, salicided junctions in the array may result in increased current leakage of the memory device.

In a typical DRAM array, the word lines need to be capped with an insulator, while in the supports the gate conductors must be exposed to allow the introduction of the dual work functions doping and salicidation. Conventional solutions to these integration problems require additional masking steps to remove the insulating gate cap from the support MOSFETs prior to the salicidation process.

In the conventional method, the contact plugs in the memory array region and the logic circuit region are performed individually. Usually, the contact plug process of the memory array region occurs before the contact plug process of the logic circuit region. A BPSG layer and a TEOS layer cover the transistors and then the stacked layer is etched to form bit line contact holes (referred to as CB holes) in the memory array region. The polysilicon material is then filled into the bit line contact holes to form bit line contact plugs. The contact plug process of the logic circuit region is performed to form gate electrode contact holes (referred to as CG holes) and junction contact holes (referred to as CS holes) in the stacked BPSG/TEOS layer in the logic circuit region. An M0 etching process is performed to define the M0 landing pad of the bit line contact plugs and the local interconnection between the gate electrode contact plug and the junction contact plug in the logic circuit region.

During formation of the bit line contact plugs, etching through the stacked TEOS /BPSG layer is necessary. However, this may cause loss of silicon atoms in the substrate, resulting in serious sub-threshold voltage and damage to the memory ability of the capacitors. The gaps between gate electrodes may be too small to etch and form the bit line contact holes, resulting in open circuits. Moreover, the spacers protecting the gate electrodes may be lost during etching, resulting in open circuits.

SUMMARY OF THE INVENTION

To solve the above mentioned problems, an object of the present invention is to provide a method of forming a bit line contact plug to prevent the loss of silicon atoms in the substrate during the etching process.

It is another object of the present invention to provide a method of forming a bit line contact plug to resolve the issue of the gaps between gate electrodes being too small to etch and form the bit line contact plugs.

It is still another object of the present invention to provide a method of forming a bit line contact plug to resolve the issue of the short circuit between the adjacent bit lines.

The present invention provides a method of forming a bit line contact structure, comprising: providing a substrate with a transistor including a gate electrode and a source/drain region thereon, the gate electrode being protected with a first insulating layer; conformally forming a titanium layer on the substrate with the transistor thereon; conformally forming a titanium nitride layer on the titanium layer; conformally forming a tungsten layer on the titanium nitride layer; defining the tungsten layer, the titanium nitride layer and the titanium layer to form an inner landing pad on the source/drain region; conformally forming a passivation layer on the inner landing pad, the transistor and the substrate; forming a second insulating layer with a even surface on the passivation layer; forming a hole in the second insulating layer and the passivation layer to expose the inner landing pad; and filling a metal material in the contact hole.

The present invention also provides a method of forming a bit line contact structure on a substrate having a memory array region and a logic circuit region and having a transistor including a gate electrode and a source/drain region thereon, the gate electrode being protected with an first insulating layer, the method comprising: conformally forming a titanium layer on the substrate with the transistor thereon; conformally forming a titanium nitride layer on the titanium layer; conformally forming a tungsten layer on the titanium nitride layer; defining the tungsten layer, the titanium nitride layer and the titanium layer to form an inner landing pad in the memory array region to contact the source/drain region; conformally forming a passivation layer on the inner landing pad, the transistor and the substrate; forming a second insulating layer with a even surface on the passivation layer; forming first, second and third contact holes in the second insulating layer and the passivation layer to expose the inner landing pad in the memory array region, the gate electrode in the logic circuit region and the source/drain region in the logic circuit region respectively; and filling a metal material in the first, second and third contact holes.

The present invention also provides a bit line contact structure, comprising: a substrate; a transistor on the substrate, the transistor including a gate electrode and a source/drain region, the gate electrode protected with a first insulating layer; an inner landing pad on a surface of the transistor and the source/drain region, the inner landing pad comprising a conformal tungsten/titanium nitride /titanium stacked layer from up to bottom; a passivation layer on the inner landing pad, the transistor and the substrate; a second insulating layer with a even surface on the passivation layer; a contact plug in the second insulating layer and the passivation layer to contact the inner landing pad; and an interconnecting landing pad on the contact plug.

BRIEF DESCRIPTION OF THE DRAWINGS

The preferred embodiment of the invention is hereinafter described with reference to the accompanying drawings in which.

DETAILED DESCRIPTION OF THE INVENTION

Figure 1A:
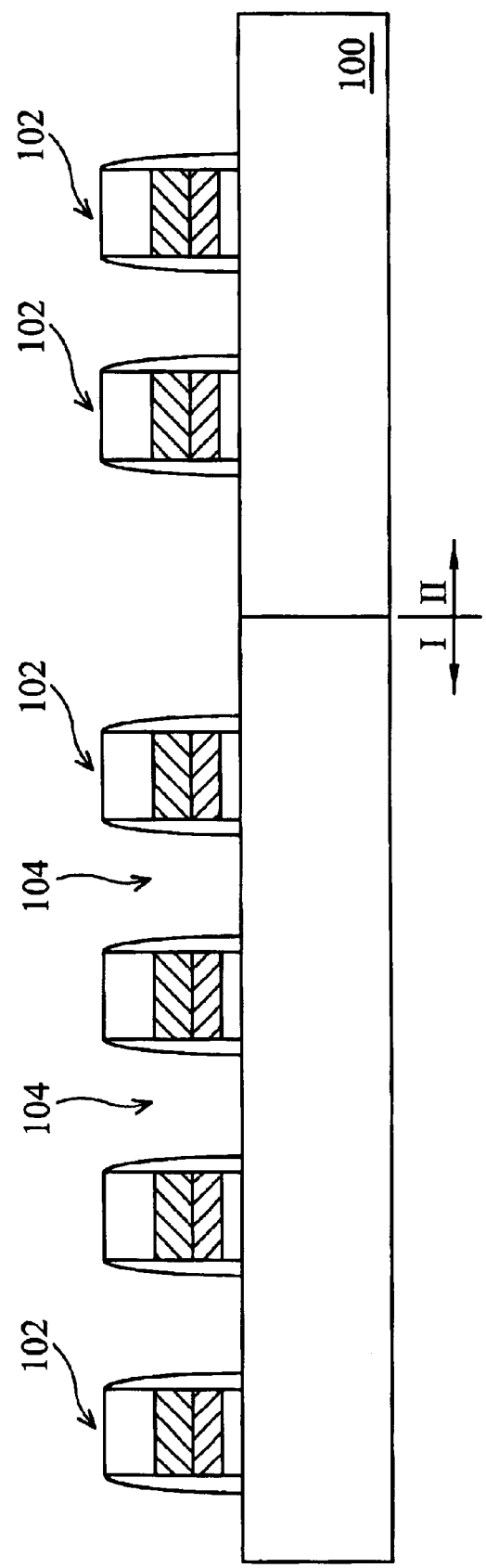
FIGS. 1A–1I are cross sections showing the method of forming a bit line contact plug according to an embodiment of the present invention.

Referring to FIG. 1A, a semiconductor substrate 100, such as a crystal silicon substrate, is provided, which has a memory array region I and a logic circuit region II. Transistors 102 are formed on the semiconductor substrate 100, and an insulator wraps the gate electrode of each transistor 102. The transistors 102 are arranged compactly in the memory array region I and the adjacent two transistors 102 have a gap 104.

Figure 1B:
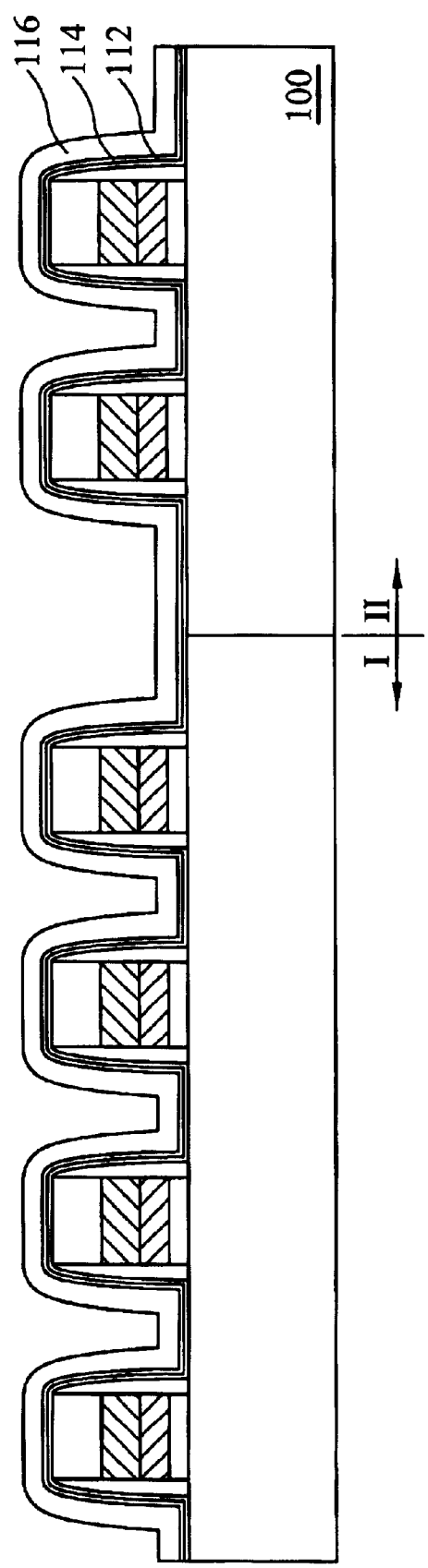

Referring to FIG. 1B, a titanium (Ti) layer 112, a titanium nitride (TiN) layer 114 and a tungsten (w) layer 116 are sequentially and conformally formed on the substrate 100 with transistors 102 thereon. The W layer 116 has a thickness of about 200–400 Å, and the thickness should be kept without sealing the gap 104 between two adjacent transistors 102.

Figure 1C:
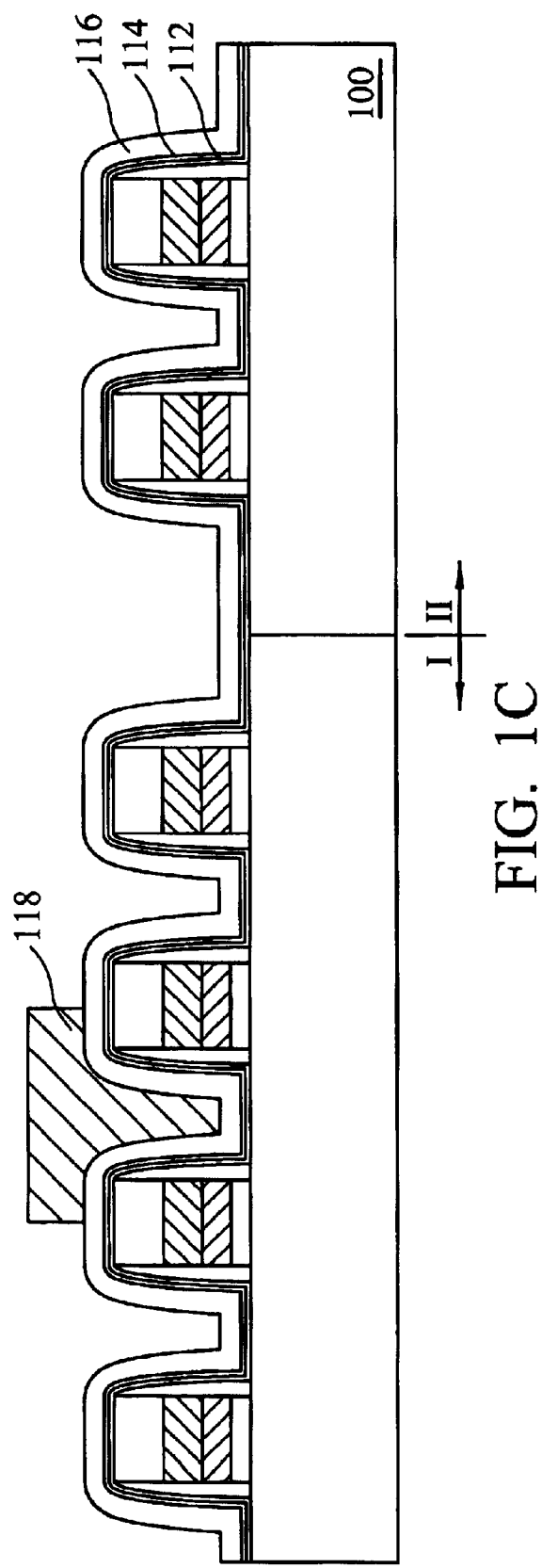
Figure 1D:
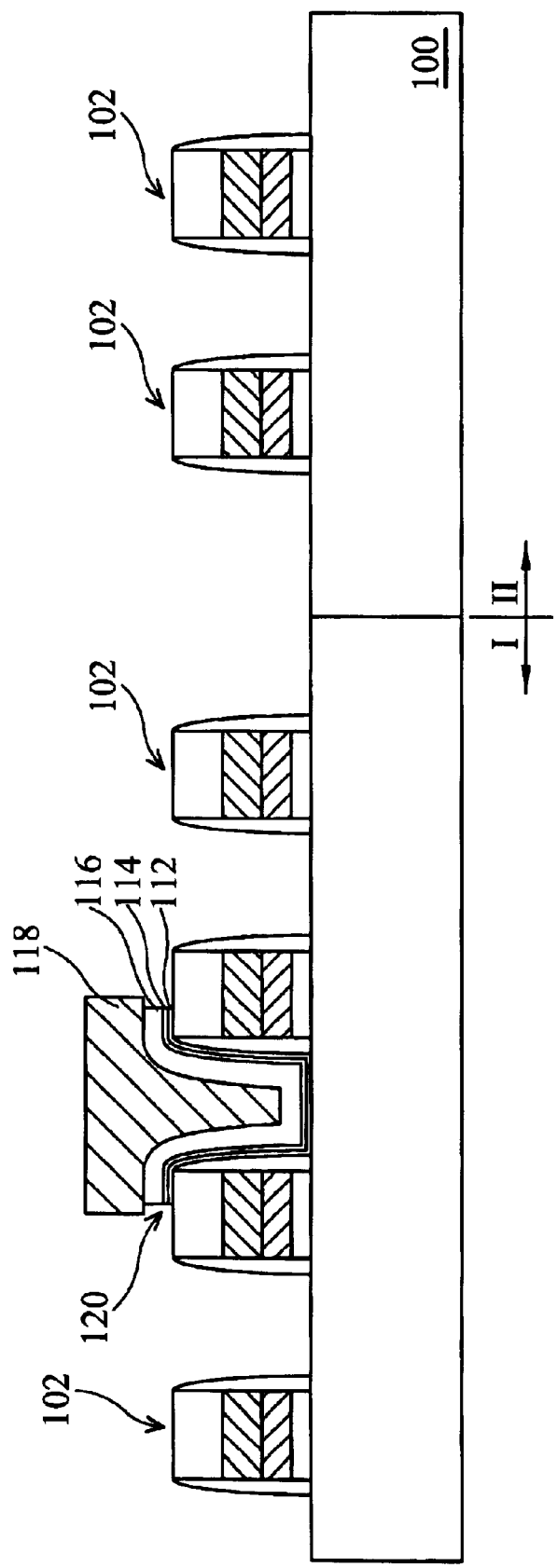

Referring to FIG. 1C, a mask layer 118, such as a photoresist layer, is formed on the stacked layer of Ti layer 112/TiN layer 114/W layer 116 to define an inner lading pad pattern for a bit line contact plug. The stacked layer of Ti layer 112/TiN layer 114/W layer 116 is etched to form an inner landing pad 120, also referred to as tungsten landing pad, as shown in FIG. 1D.

The W layer 116 can be etched by dry etching using $Cl_2/F_2/O_2$ or wet etching using APM solution ($NH_4OH—H_2O_2—H_2O$) at about 40° C.

Figure 1E:
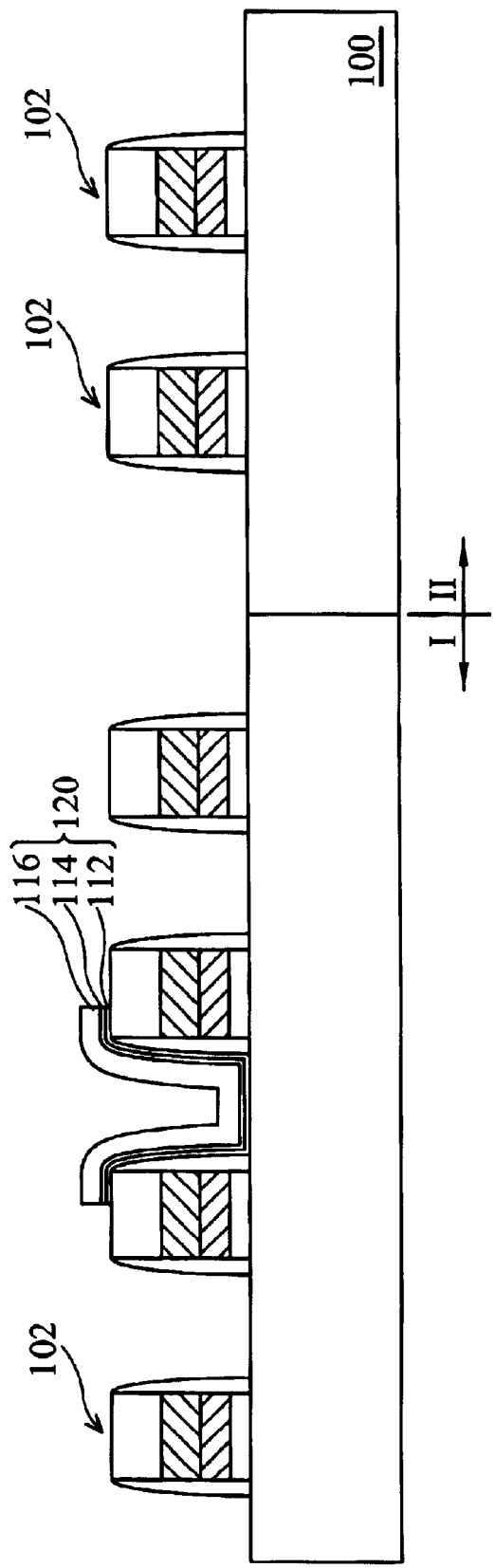
Figure 1F:
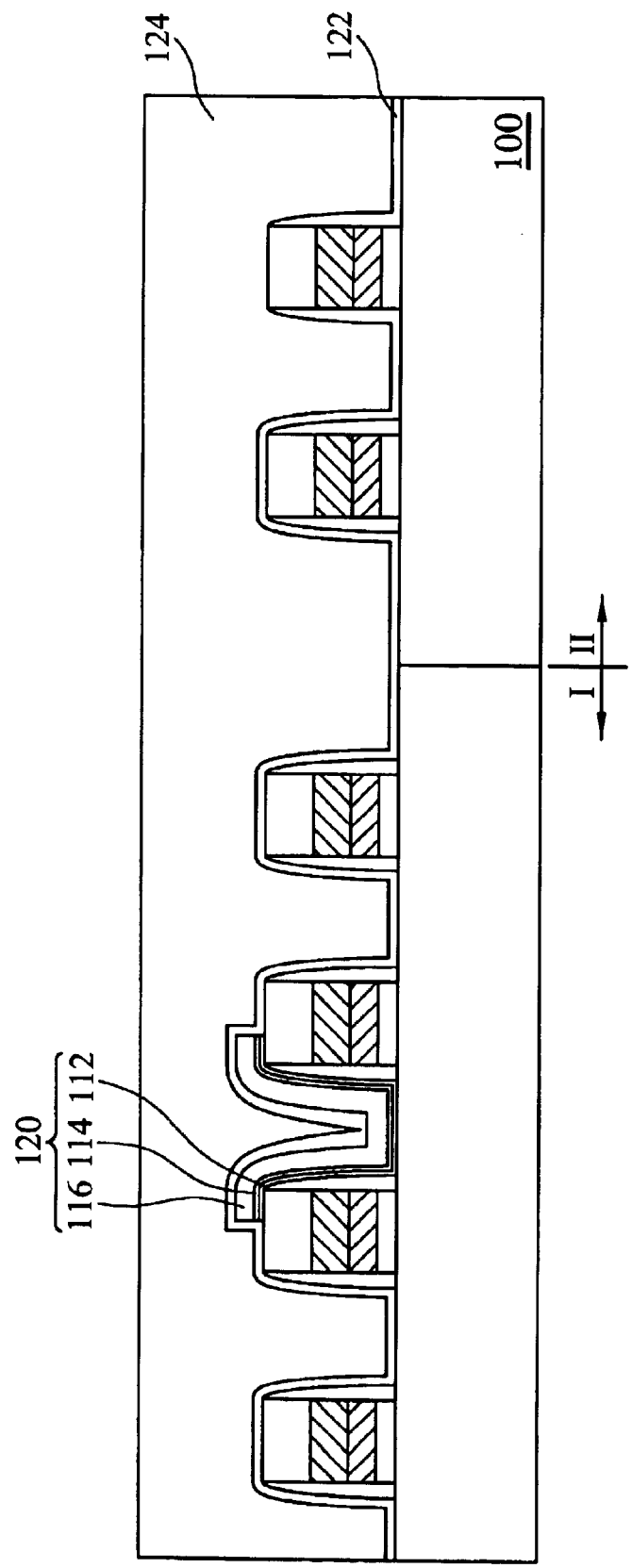

The mask layer 118 is then removed to expose a surface of the inner landing pad 120, as shown in FIG. 1E.

Referring to 1F, an insulating liner layer 122, such as silicon nitride layer, is conformally formed on the substrate 100 having the inner landing pad 120 thereon to prevent the dopants in a to be formed insulating layer from out-diffusion to the transistors 102 or the substrate 100. The insulating liner layer 122 has a thickness of about 110–130 Å.

An insulating layer 124 with even surface is formed on the insulating liner layer 122. The insulating layer 124 can be a stacked layer of BPSG/TEOS, which are formed by depositing BPSG with a thickness of about 5900–7300 Å, performing chemical mechanical polishing to planarize the BPSG layer until a part of the insulating liner layer 122 is exposed, and depositing TEOS (tetraethylorthosilicate) with a thickness of about 3600–4400 Å.

Figure 1G:
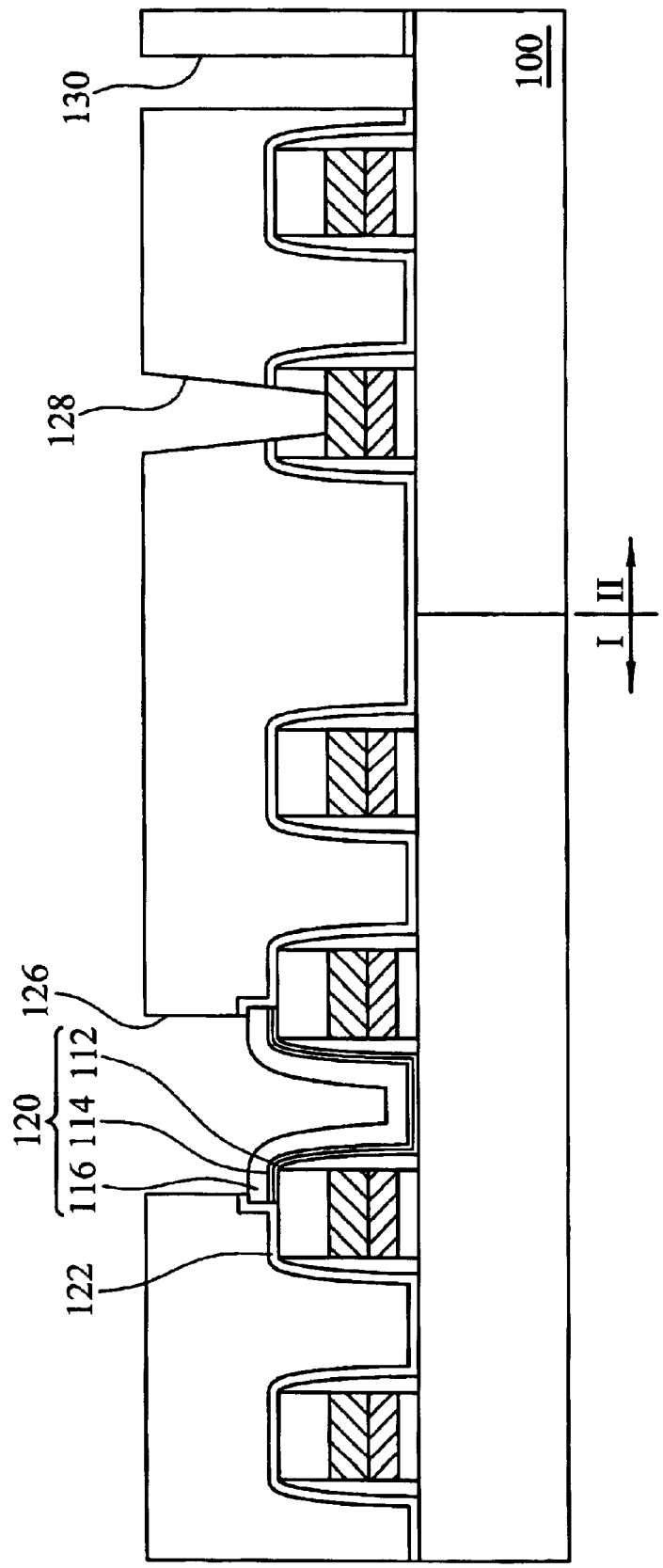

Referring to FIG. 1G, an etching process is performed to form a bit line contact hole 126 in the memory array region I and a gate electrode contact hole 128 and a junction contact hole 130 in the logic circuit region II. The surfaces of the gate electrode and the doped region in the substrate are exposed in the contact holes 128 and 130 in the logic circuit region II.

Figure 1H:
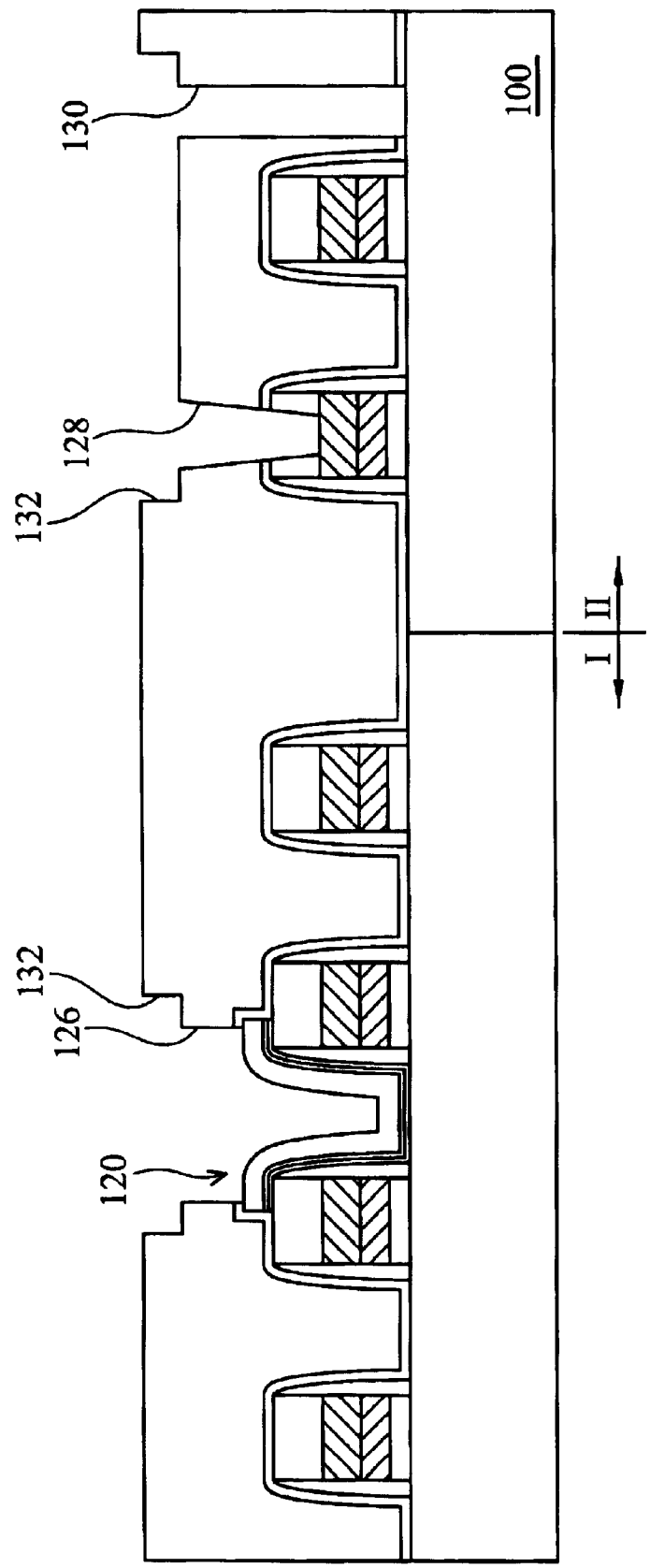
Figure 1I:
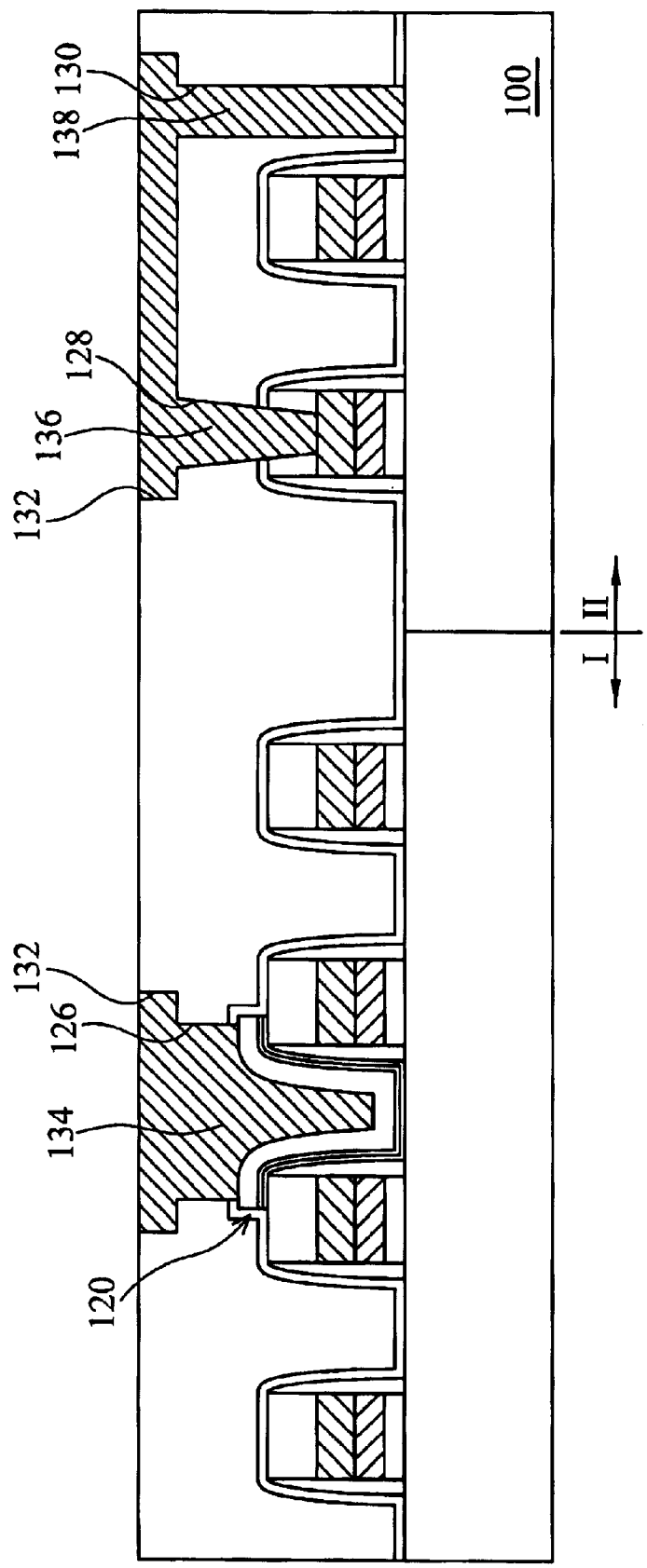

M0 etching and depositing processes are performed, as shown in FIGS. 1H and 1I.

Referring to FIG. 1H, an etching process forming an M0 landing pad and local interconnection is performed to form an M0 landing pad and local interconnection recesses 132 in the insulating layer 124, thereby defining a landing pad pattern and a local interconnection pattern.

Referring to FIG. 1I, tungsten metal is filled in the recess 132 and the contact holes 126, 128 and 130. A chemical mechanical polishing is performed to remove the unnecessary tungsten on the insulating layer 124 to form a bit line contact plug 134 with the inner landing pad 120 and contact plugs 136 and 138 with the local interconnection.

Figure 2A:
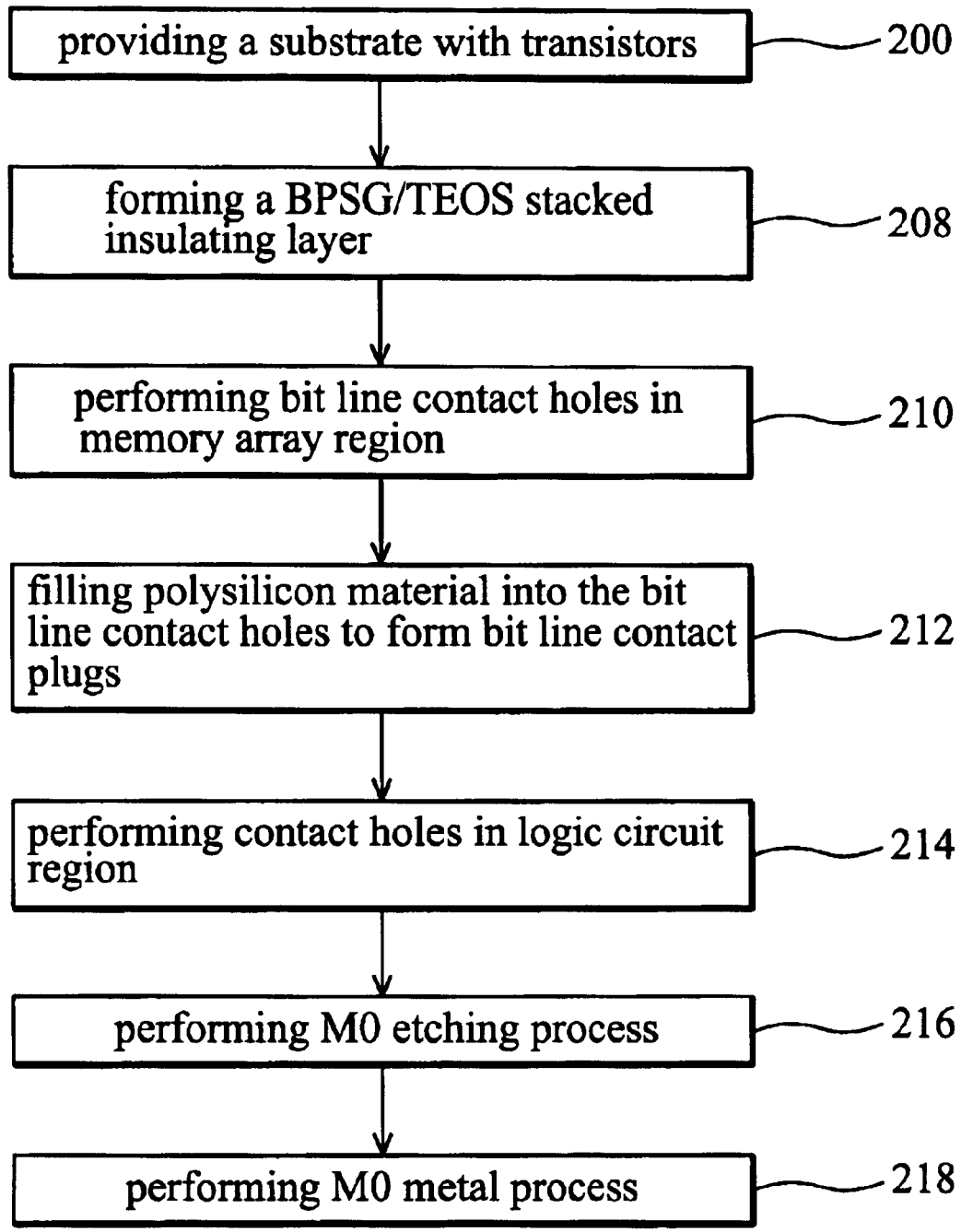
FIG. 2A is a flow chart showing the traditional method of forming a bit line contact plug.
Figure 2B:
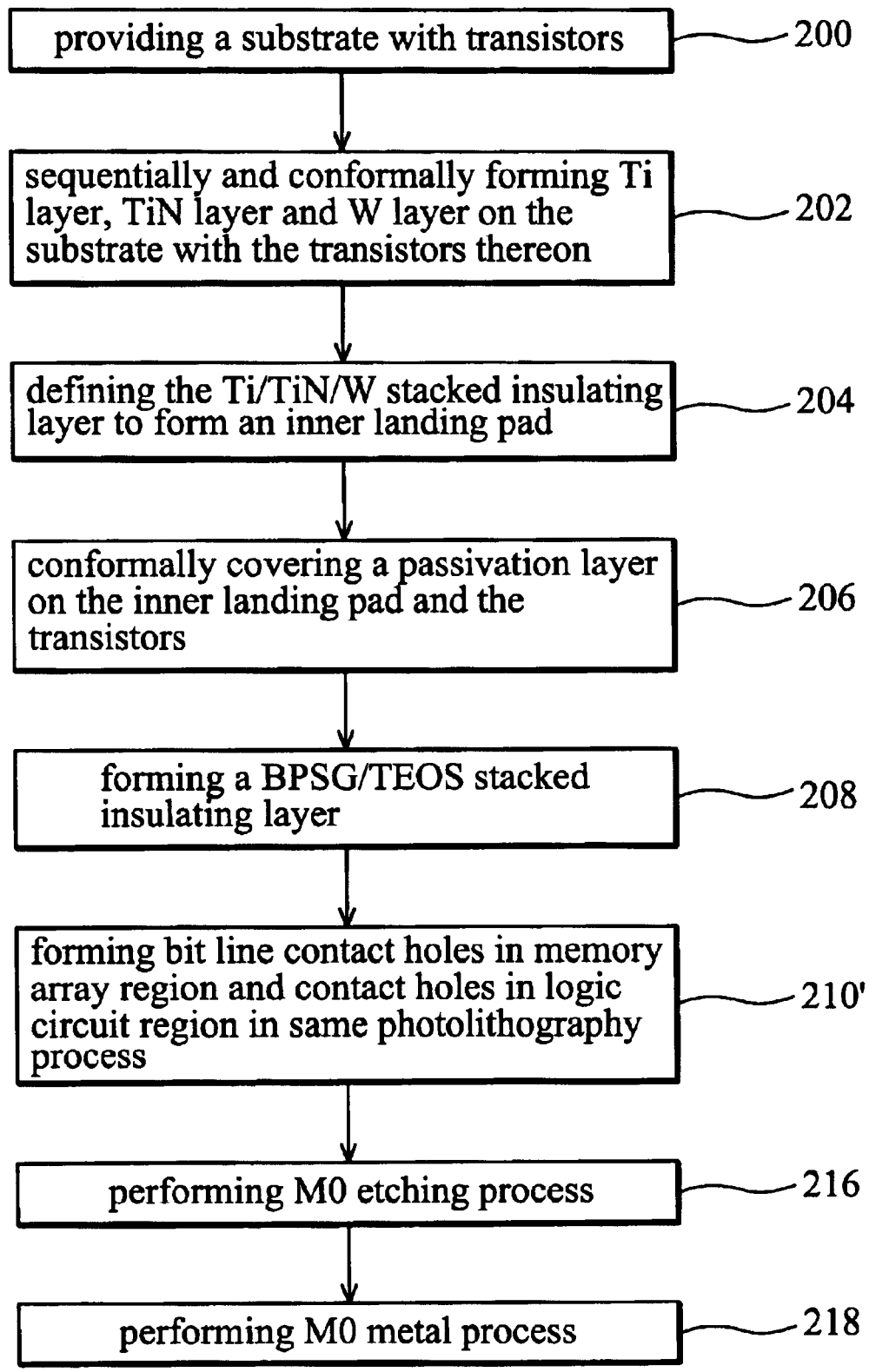
FIG. 2B is a flow chart showing the method of forming a bit line contact plug according to an embodiment of the present invention.

The traditional process, as shown in FIG. 2A, is compared with the present process, as shown in FIG. 2B, hereafter.

After the step 200 of providing a substrate with transistors, and before the step 208 of forming a BPSG/TEOS stacked insulating layer, the steps 202, 204 and 206 are performed in the present invention to sequentially and conformally form a Ti layer, TiN layer and W layer on the substrate with the transistors thereon, to define the Ti/TiN/W stacked layer to form an inner landing pad, and to conformally cover a passivation layer on the inner landing pad and the transistors.

Moreover, the contact plugs in memory array and logic circuit regions are performed individually in the traditional method, that is, after the steps 200 and 208, the step 210 of performing the bit line contact holes in memory array region, the step 212 of filling polysilicon material into the bit line contact holes to form bit line contact plugs, and the step 214 of performing the contact holes in logic circuit region are followed. On the contrary, in the present invention, the bit line contact holes in memory array region and the contact holes in logic circuit region are formed in the same photolithography process, that is, step 210'.

Then, the M0 etching process of step 216 and the M0 metal process of step 218 are performed to form the inner landing pad and the local interconnection in the traditional method and the present invention.

As mentioned above, the bit line contact structure comprises the inner landing pad, the contact plug, and an upper layer of the interconnection landing pad. The inner landing pad improves the process window of contact plug, and the interconnection landing pad improves the interconnection process window.

Furthermore, the inner landing pad process precedes covering an insulating layer on the surface of the transistors; therefore, the etching time is reduced so as to prevent the loss of silicon atoms in the substrate during the etching process. The issues of open circuits resulting from the gaps between gate electrodes being too small to etch and form the bit line contact plugs and short circuits between the adjacent bit lines are also prevented.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a bit line contact structure, comprising:

providing a substrate with a transistor, including a gate electrode and a source/drain region thereon, formed on a surface of the substrate, wherein the gate electrode is protected with a first insulating layer;

conformally forming a titanium layer on the substrate to fully and directly cover the transistor and a surface uncovered by the transistor;

conformally forming a titanium nitride layer on the titanium layer;

conformally forming a tungsten layer on the titanium nitride layer;

defining the tungsten layer, the titanium nitride layer and the titanium layer to form an inner landing pad conformally and directly covering the source/drain region and a sidewall of the transistor;

conformally forming a passivation layer on the inner landing pad, the transistor and the substrate;

forming a second insulating layer with an even surface on the passivation layer;

forming a contact hole in the second insulating layer and the passivation layer to expose the inner landing pad; and filling a metal material in the contact hole.

2. The method of claim 1, wherein a thickness of the tungsten layer is 200–400 Å.

3. The method of claim 1, wherein the tungsten layer is defined by dry etching.

4. The method of claim 3, wherein the tungsten layer is dry etched with $Cl_2/F_2/O_2$.

5. The method of claim 1, wherein the tungsten layer is defined by wet etching.

6. The method of claim 5, wherein the tungsten layer is wet etched with an APM solution ($NH_4OH$—$H_2O_2$—$H_2O$) at about 40° C.

7. The method of claim 1, wherein the passivation layer comprises silicon nitride.

8. The method of claim 1, wherein the passivation layer has a thickness of 110–130 Å.

9. The method of claim 1, wherein the second insulating layer is a BPSG/TEOS stacked layer.

10. The method of claim 9, wherein a method of forming a BPSG layer of the BPSG/TEOS stacked layer comprises:

depositing a material of BPSG on the passivation layer; and polishing the material of BPSG until a part of the passivation layer is exposed.

11. The method of claim 10, wherein the BPSG layer of the BPSG/TEOS stacked layer has a thickness of 5900–7300 Å and a TEOS layer of the BPSG/TEOS stacked layer has a thickness of 3600–4400 Å.

12. The method of claim 1, wherein the metal material filled in the contact hole is tungsten.

13. A method of forming a bit line contact structure on a substrate having a memory array region and A logic circuit region and having a transistor including a gate electrode and a source/drain region thereon, the gate electrode protected with a first insulating layer, the method comprising:

conformally forming a titanium layer on the substrate with the transistor thereon;

conformally forming a titanium nitride layer on the titanium layer;

conformally forming a tungsten layer on the titanium nitride layer;

defining the tungsten layer, the titanium nitride layer and the titanium layer to form an inner landing pad in the memory array region to contact the source/drain region;

conformally forming a passivation layer on the inner landing pad, the transistor and the substrate;

forming a second insulating layer with an even surface on the passivation layer;

forming first, second and third contact holes in the second insulating layer and the passivation layer to expose the inner landing pad in the memory array region, the gate electrode in the logic circuit region and the source/drain region in the logic circuit region respectively; and filling a metal material in the first, second and third contact holes.

14. The method of claim 13, wherein a thickness of the tungsten layer is 200–400 Å.

15. The method of claim 13, wherein the tungsten layer is defined by dry etching.

16. The method of claim 15, wherein the tungsten layer is dry etched with $Cl_2/F_2/O_2$.

17. The method of claim 13, wherein the tungsten layer is defined by wet etching.

18. The method of claim 17, wherein the tungsten layer is wet etched with an APM solution ($NH_4OH$—$H_2O_2$—$H_2O$) at about 40° C.

19. The method of claim 13, wherein the passivation layer comprises silicon nitride.

20. The method of claim 13, wherein the passivation layer has a thickness of 110–130 Å.

21. The method of claim 13, wherein the second insulating layer is a BPSG/TEOS stacked layer.

22. The method of claim 21, wherein a method of forming a BPSG layer of the BPSG/TEOS stacked layer comprises:

depositing a material of BPSG on the passivation layer; and polishing the material of BPSG until a part of the passivation layer is exposed.

23. The method of claim 22, wherein the BPSG layer of the BPSG/TEOS stacked layer has a thickness of 5900–7300 Å, and a TEOS layer of the BPSG/TEOS stacked layer has a thickness of 3600–4400 Å.

24. The method of claim 13, wherein the metal material filled in the first, second and third contact holes is tungsten.

25. A bit line contact structure, comprising:

a substrate;

two adjacent transistors on the substrate, the transistor including a gate electrode and a source/drain region, the gate electrode protected with a first insulating layer;

conformal inner landing pad formed to fully and directly cover a sidewall of the transistors and the source/drain region between the two adjacent transistors, the conformal inner landing pad comprising a titanium/titanium nitride/tungsten stacked layer from the bottom up;

a passivation layer on the transistors and the substrate;

a second insulating layer with an even surface on the passivation layer;

a contact plug in the second insulating layer and the passivation layer to contact the inner landing pad; and an interconnecting landing pad on the contact plug.

26. The bit line contact structure of claim 25, wherein a thickness of the tungsten layer of the inner landing pad is 200–400 Å.

27. The bit line contact structure of claim 25, wherein the passivation layer comprises silicon nitride.

28. The bit line contact structure of claim 27, wherein the passivation layer has a thickness of 110–130 Å.

29. The bit line contact structure of claim 27, wherein the contact plug and the interconnecting landing pad comprises tungsten.

* * * * *